United States Patent
Chen et al.

(10) Patent No.: US 7,588,883 B2
(45) Date of Patent: Sep. 15, 2009

(54) METHOD FOR FORMING A GATE AND ETCHING A CONDUCTIVE LAYER

(75) Inventors: Neng-Kuo Chen, Hsin-Chu (TW); Teng-Chun Tsai, Hsin-Chu (TW); Hsiu-Lien Liao, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 512 days.

(21) Appl. No.: 11/382,470

(22) Filed: May 9, 2006

(65) Prior Publication Data

US 2007/0264836 A1 Nov. 15, 2007

(51) Int. Cl.
*G03F 1/00* (2006.01)
*H01L 21/00* (2006.01)

(52) U.S. Cl. .............. 430/322; 430/311; 430/313; 430/317; 216/51; 216/108; 438/724; 438/744

(58) Field of Classification Search .............. 430/313, 430/317, 311, 322; 438/724, 744, FOR. 127; 216/51, 108
See application file for complete search history.

(56) References Cited

U.S. PATENT DOCUMENTS 6,673,659 B2    1/2004  Sakama et al.
6,774,462 B2    8/2004  Tanaka et al.
2004/0242019 A1*  12/2004  Klein et al. ............ 438/757
2007/0065963 A1*  3/2007  Van Kampen et al. ...... 438/48
2008/0197109 A1  8/2008  Mui et al.

FOREIGN PATENT DOCUMENTS

| TW | 429452 | 4/2001 |
| TW | 468228 | 12/2001 |
| TW | 479370 | 3/2002 |
| TW | 559862 | 11/2003 |
| TW | 561513 | 11/2003 |

* cited by examiner

*Primary Examiner*—Thorl Chea
(74) *Attorney, Agent, or Firm*—Winston Hsu

(57) ABSTRACT

A method for forming a gate and a method for etching a conductive layer are provided. First, a substrate is provided, including a dielectric layer and a conductive layer on its surface in order. Subsequently, a patterned silicon nitride layer is formed on the conductive layer as a hard mask, and the hydrogen concentration of the patterned silicon nitride layer is more than $10^{22}$ atoms/cm$^3$. Thereafter, the conductive layer and the dielectric layer are etched utilizing the hard mask as a mask. Finally, an etching solution is utilized to remove the hard mask.

17 Claims, 20 Drawing Sheets

|  | N-H bond (E22) | Si-H bond (E22) | Total hydrogen concentration (E22) | Etching rate (A/min) |
|---|---|---|---|---|
| Traditional silicon nitride layer | 0.08 | 0.63 | 0.71 | 10 |
| Silicon nitride layer1 | 0.03 | 1.12 | 1.15 | 30 |
| Silicon nitride layer2 | 0.92 | 0.46 | 1.38 | 48.2 |
| Silicon nitride layer3 | 1.00 | 0.99 | 2.00 | 72 |
| Silicon nitride layer4 | 0.39 | 2.10 | 2.50 | 100 |

Fig. 19

METHOD FOR FORMING A GATE AND ETCHING A CONDUCTIVE LAYER

BACKGROUND OF THE INVENTION

1. Field of the Invention

The present invention relates to a method for forming a gate and etching a conductive layer, and more particularly, to a method of etching polysilicon and silicon oxide by utilizing a patterned silicon nitride layer with high hydrogen concentration as a hard mask, and removing the patterned silicon nitride layer utilizing a low-temperature phosphoric acid solution, so as to remove the patterned silicon nitride layer without damaging the structures of polysilicon and silicon oxide.

2. Description of the Prior Art

Metal-oxide-semiconductors (MOS) are important electronic devices in the fabrication of integrated circuits. As the sizes of semiconductor devices become smaller and smaller, MOS fabrication is constantly enhanced for fabricating MOS devices with smaller sizes and higher quality. Due to the miniaturization, it is more and more important to prevent the fabrication processes from damaging the gate dielectric layers of MOS devices.

Please refer to FIG. 1 through FIG. 4. FIG. 1 through FIG. 4 are schematic diagrams showing the common means of fabricating a gate utilizing a patterned hard mask. As shown in FIG. 1, a substrate 12 is provided, including a dielectric layer 14, a conductive layer 16, a mask layer 18 and a photoresist layer 24 on its surface in order. The dielectric layer 14 usually includes silicon oxide, and the conductive layer 16 includes doped polysilicon. Subsequently, as shown in FIG. 2, the photoresist layer 24 is patterned by an exposure-and-development process. As shown in FIG. 3, the mask layer 18 is etched to become a patterned hard mask 18a by utilizing the patterned photoresist layer 24 as an etching mask, and the photoresist layer 24 is removed by an ashing process. Next, as shown in FIG. 4, the conductive layer 16 and the dielectric layer 14 are etched by utilizing the patterned hard mask 18a as an etching mask so as to form a gate 26. The patterned hard mask 18a is removed thereafter to form the gate structure of a MOS.

As known by those skilled in this art, after forming a gate structure on a substrate, a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. Finally, a silicide material is often formed over the surface of the gate structure and the source/drain region to improve the ohmic contact between the contact plugs and the gate structure and the source/drain region.

Nevertheless, the process of removing the patterned hard mask 18a causes some problems. Please refer to FIG. 5. FIG. 5 is schematic diagram showing a traditional gate formed by utilizing oxide or oxynitride as a patterned hard mask. The traditional process utilizes oxide or oxynitride as a patterned hard mask and removes the patterned hard mask by diluted hydrofluoric acid. As shown in FIG. 5, because the diluted hydrofluoric acid could etch oxide with a high rate, the diluted hydrofluoric acid also etches the dielectric layer 14 that includes oxide during the process of removing the patterned hard mask. Thus, defects, such as the undercut effect, may be caused in the dielectric layer 14, and the device reliability is decreased.

In consideration of the previous problem, the prior art uses silicon nitride as the material of the patterned hard mask 18a. Please refer to FIG. 6. FIG. 6 is schematic diagram showing a gate formed by utilizing silicon nitride as a patterned hard mask according to the prior art. In the prior art, the semiconductor substrate is immersed in a phosphoric acid solution at 155° C. to 170° C. in an etching tank, so as to remove the patterned hard mask including silicon nitride. However, as shown in FIG. 6, the hot phosphoric acid solution also etches and damages the surface of the conductive layer 16 including polysilicon during the process of removing the patterned hard mask. This causes defects in the shape or the surface condition of the gate 26, and decreases the quality of the resulting salicide. Thereafter, the high electric resistance may be caused in the gate 26, and may influence the operation of the gate 26.

In order to prevent the polysilicon conductive layer from being affected by the hot phosphoric acid solution, a technology of using a lower temperature phosphoric acid solution to remove the silicon nitride mask is being developed. However, because silicon nitride is quite chemically stable, the removal rate of the silicon nitride mask is very slow when utilizing the lower temperature phosphoric acid solution. Thereafter, the etching process takes a long time, increases the cost, and cannot remove the hard mask well enough.

SUMMARY OF THE INVENTION

It is therefore an objective of the present invention to provide a method for forming a gate and a method for etching a conductive layer to improve the above-mentioned problems and to remove the silicon nitride layer without damaging polysilicon.

According to the present invention, a method for forming a gate is provided. First, a substrate is provided, and the substrate comprises a dielectric layer and a conductive layer in order. Subsequently, a patterned hard mask is formed on the conductive layer, and the patterned hard mask comprises silicon nitride that has a hydrogen concentration of more than $10^{22}$ atoms/cm$^3$. Next, the conductive layer and the dielectric layer are etched by utilizing the patterned hard mask as a mask. Finally, the patterned hard mask is removed by utilizing an etching solution.

Another aspect of the present invention discloses a method for etching a conductive layer. First, a substrate is provided. The substrate comprises a dielectric layer and the conductive layer in order. Subsequently, a patterned silicon nitride layer is formed on the conductive layer, and the patterned silicon nitride layer has a hydrogen concentration more than $10^{22}$ atoms/cm$^3$. Next, the conductive layer and the dielectric layer are etched by utilizing the patterned silicon nitride layer as a mask. Finally, the patterned silicon nitride layer is removed by utilizing an etching solution.

The present invention relates to a method of etching polysilicon conductive layer and oxide dielectric layer by utilizing a patterned silicon nitride layer with high hydrogen concentration as a hard mask, and removing the patterned silicon nitride layer utilizing a low-temperature phosphoric acid solution. The present invention can remove the patterned silicon nitride layer without damaging the structures of the polysilicon conductive layer and the oxide dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 19 is a chart illustrating the components of silicon nitride layers and the etching rates of the silicon nitride layers.

DETAILED DESCRIPTION

The present invention relates to a method for forming a gate of a MOS device, a gate of a strained-silicon transistor, gates of a variety of memories, or other semiconductor components, such as a capacitor. Please refer to FIG. 7 through FIG. 12. FIG. 7 through FIG. 12 are schematic diagrams showing the method of etching a conductive layer according to a preferred embodiment of the present invention. It is to be understood that the drawings are not drawn to scale and are provided only for illustration purposes.

Figure 1:
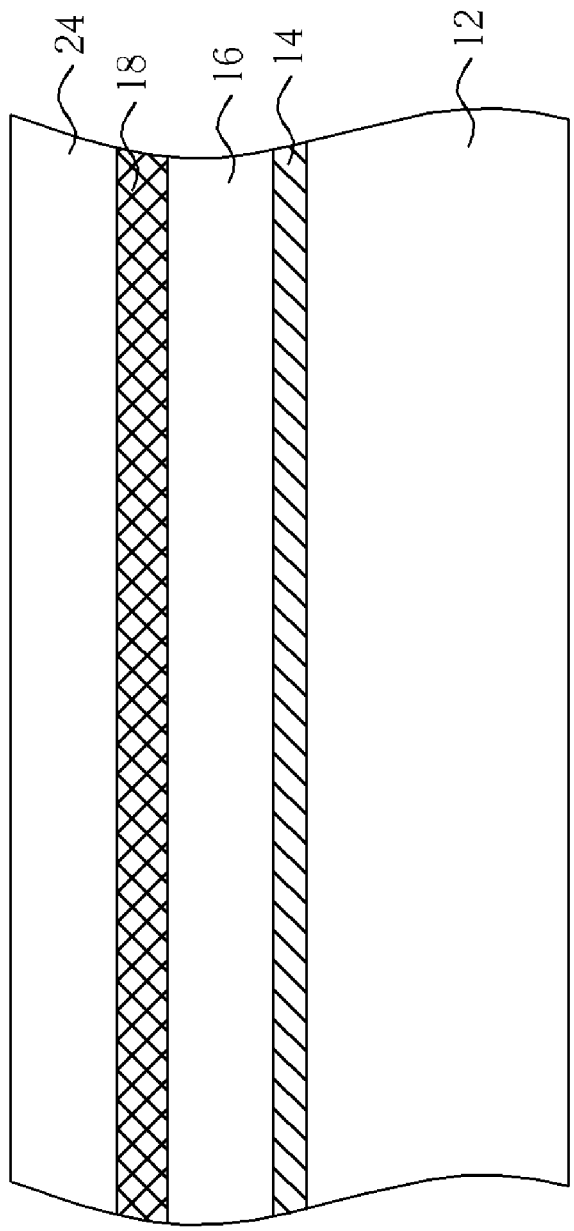
FIG. 1 through FIG. 4 are schematic diagrams showing a common means of fabricating a gate utilizing a patterned hard mask.
Figure 2:
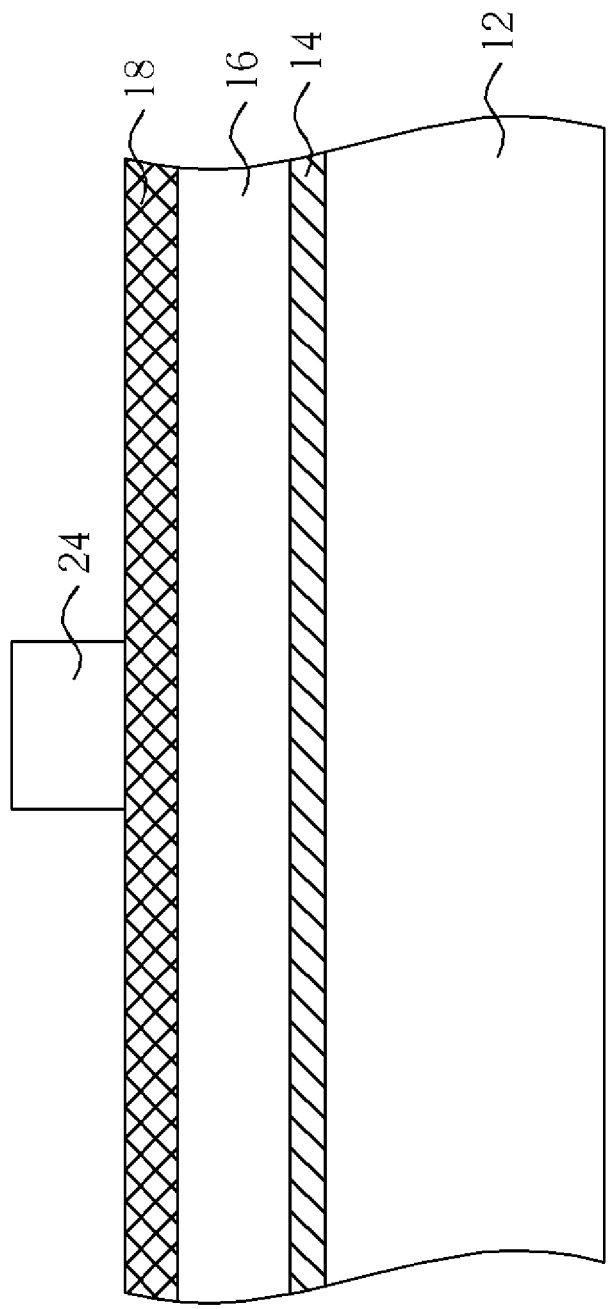
Figure 3:
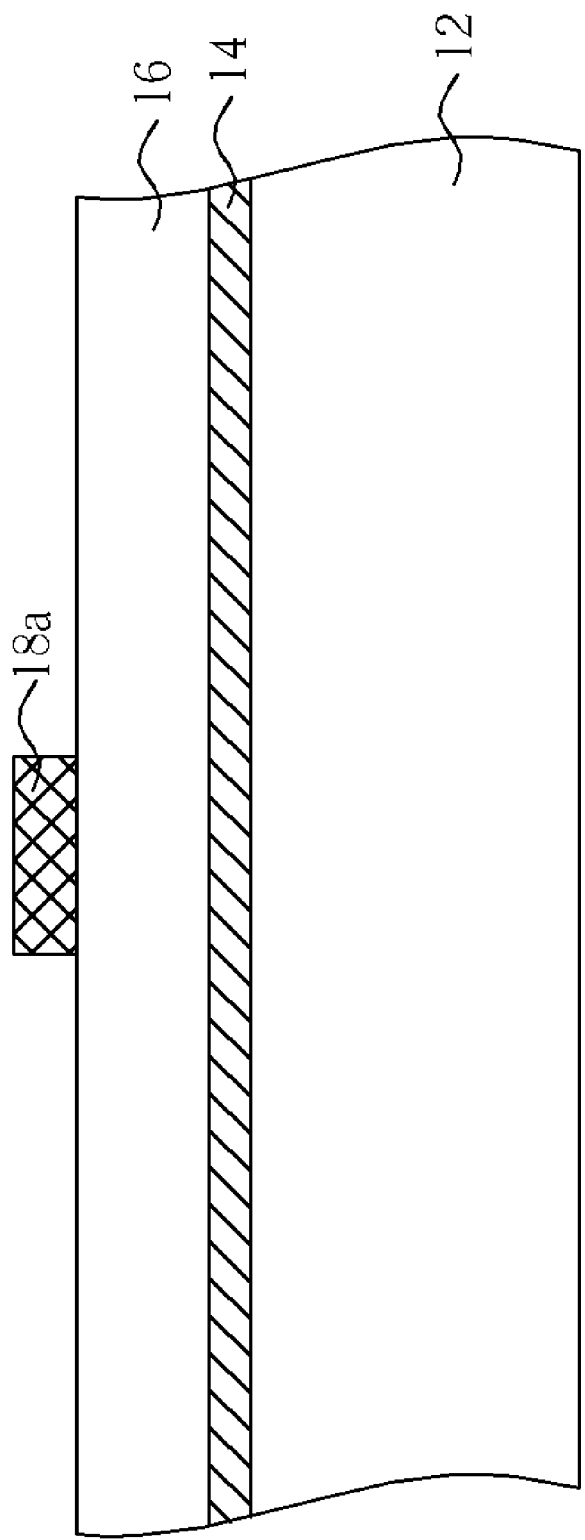
Figure 4:
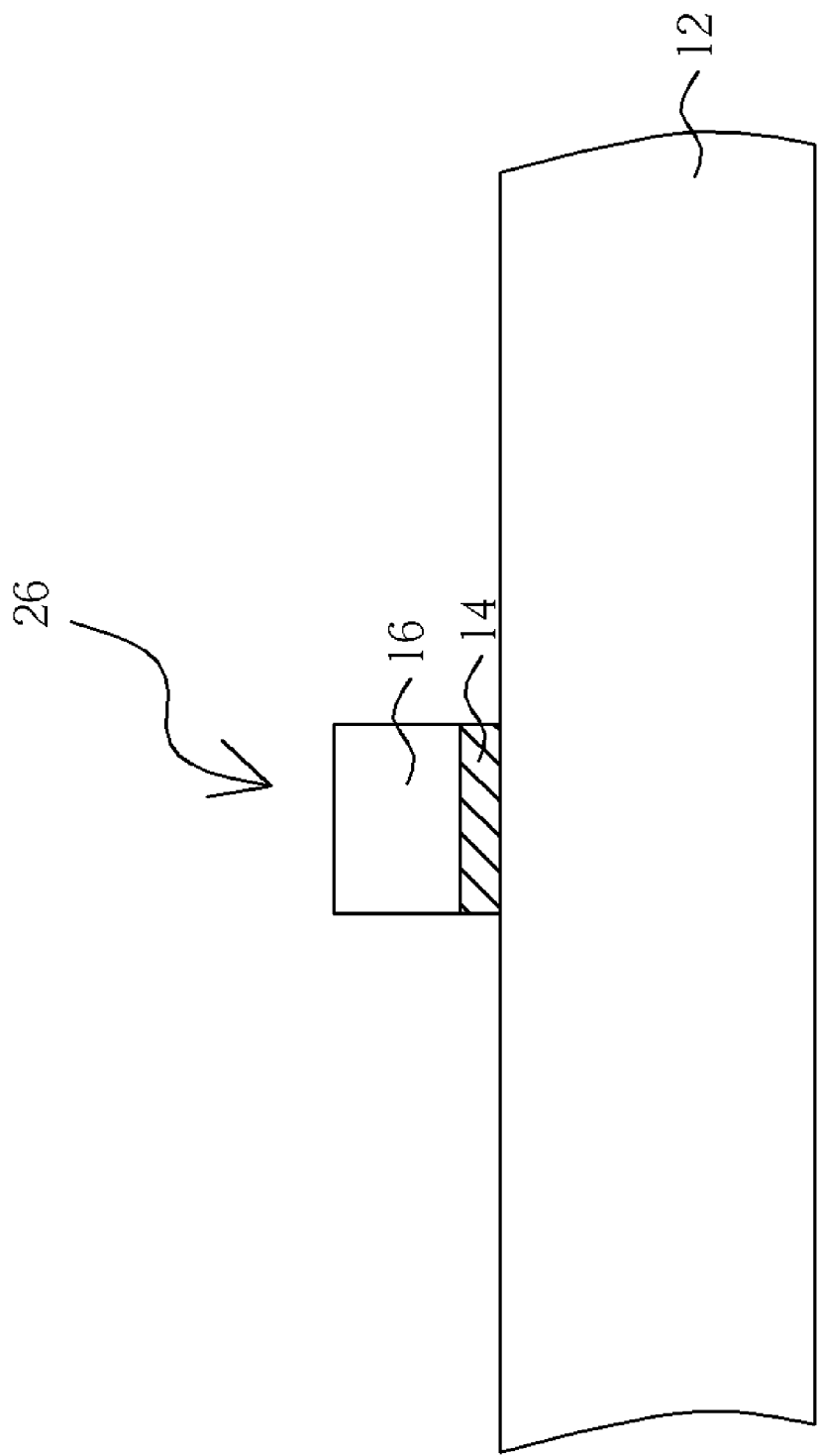
Figure 5:
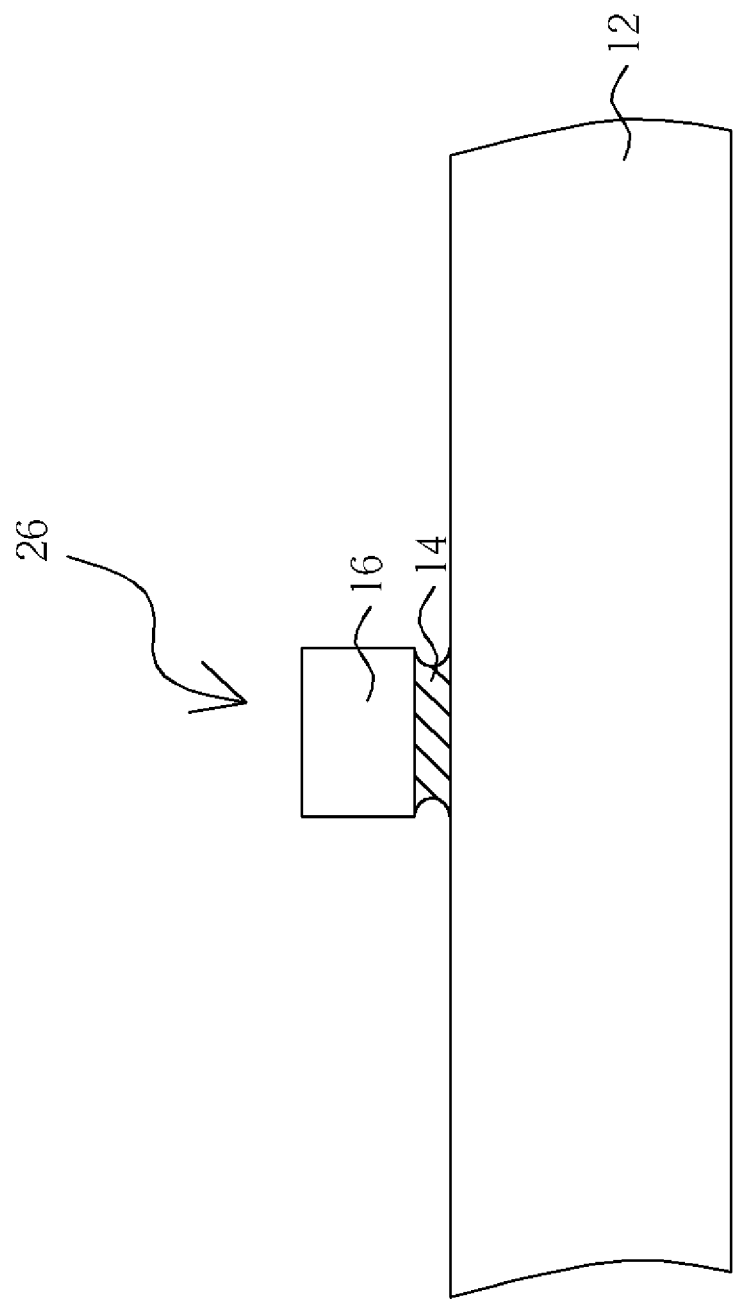
FIG. 5 is schematic diagram showing a traditional gate formed by utilizing oxide or oxynitride as a patterned hard mask.
Figure 6:
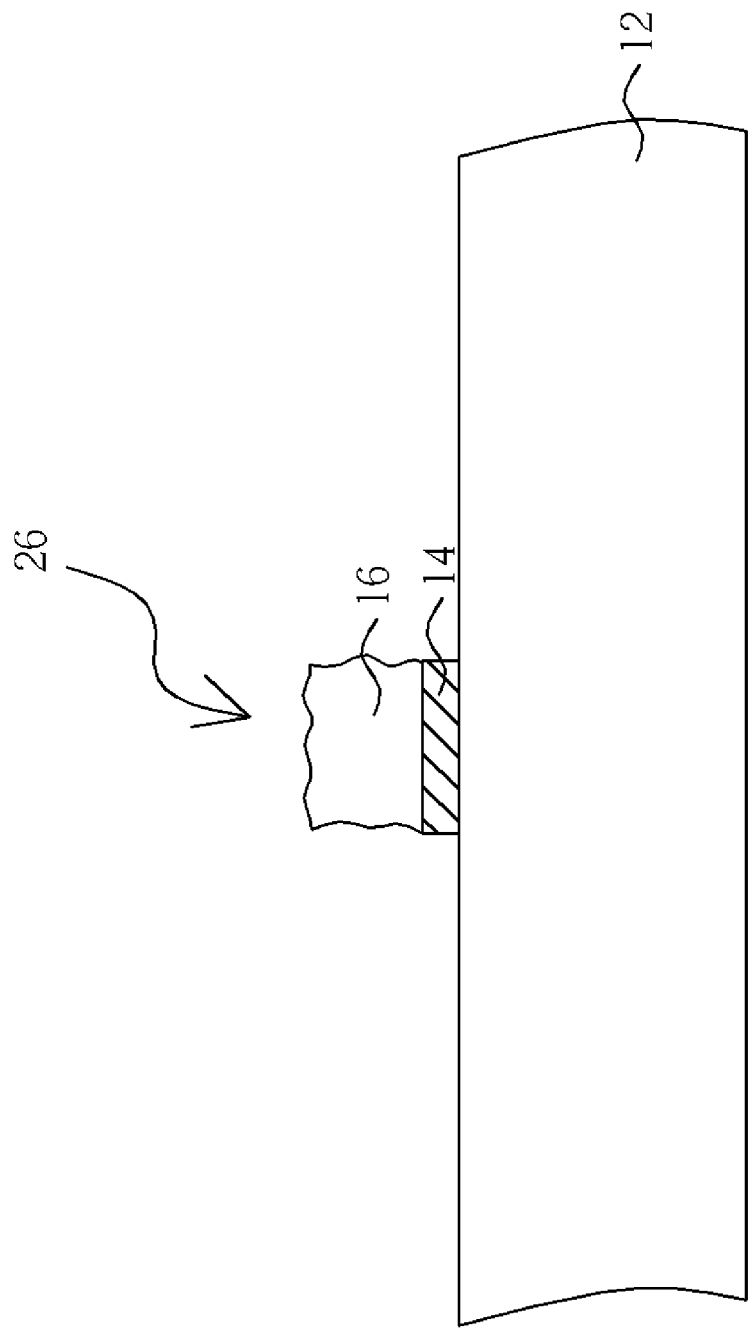
FIG. 6 is schematic diagram showing a gate formed by utilizing silicon nitride as a patterned hard mask according to the prior art.
Figure 7:
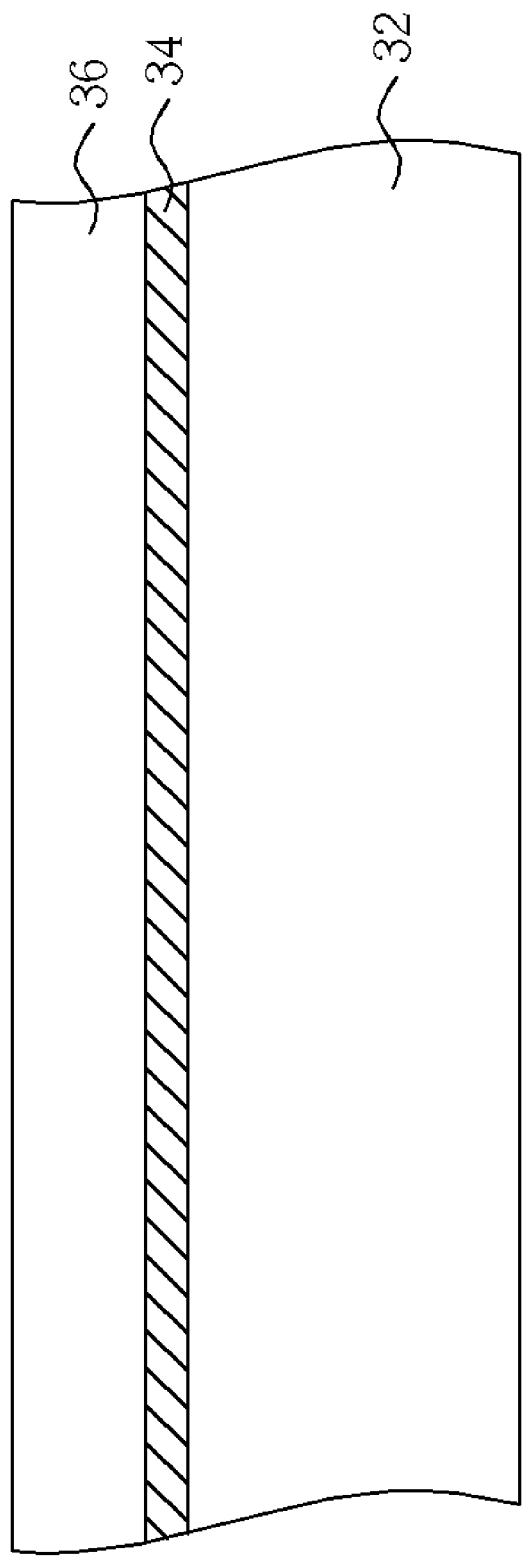
FIG. 7 through FIG. 12 are schematic diagrams showing the method of etching a conductive layer according to a preferred embodiment of the present invention.

As shown in FIG. 7, a substrate 32 is provided, including a dielectric layer 34 and a conductive layer 36 on its surface in order. The substrate 32 may be an n-type semiconductor substrate or a p-type semiconductor substrate, such as a semiconductor wafer or a silicon-on-insulator (SOI). The dielectric layer 34 usually includes high-k materials, such as silicon oxide. For example, a rapid thermal oxidation (RTO) process and a remote plasma nitridation (RPN) treatment are performed to form silicon dioxide as the dielectric layer 34. In addition, the conductive layer 36 includes silicon, polysilicon, or doped polysilicon.

Figure 8:
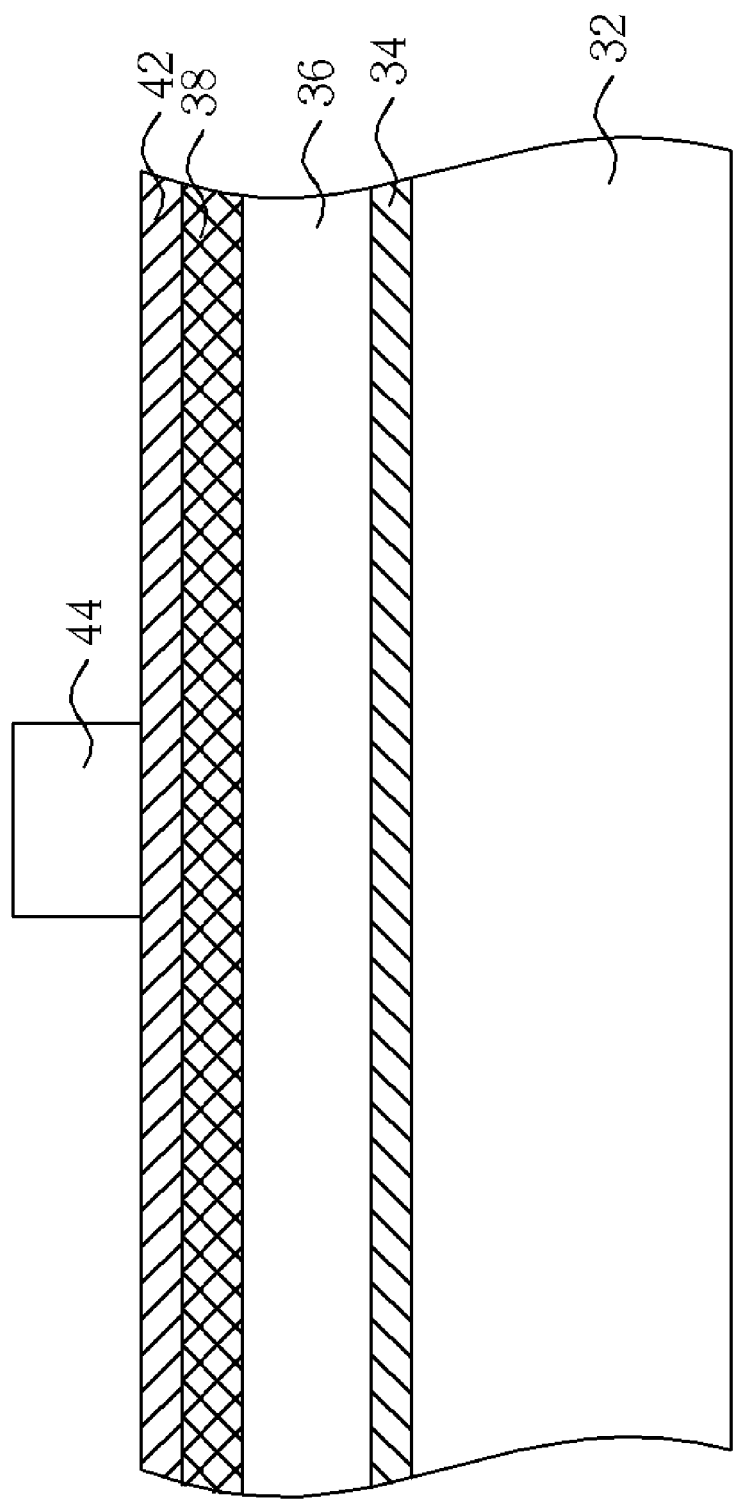

Subsequently, as shown in FIG. 8, a silicon nitride layer 38, a silicon oxide layer 42 and a patterned photoresist layer 44 are formed on the conductive layer 36 in order. In other words, the silicon nitride layer 38 is first deposited by a chemical vapor deposition (CVD) process, wherein the thickness of the silicon nitride layer 38 is about 50 to 1000 angstroms, such as 300 angstroms. The silicon oxide layer 42 is thereafter deposited with a thickness about 50 to 1000 angstroms, such as 100 angstroms. Next, a photoresist layer is spun on the surface of the silicon oxide layer 42, and the photoresist layer is patterned by an exposure-and-development process so as to transform the photoresist layer into the patterned photoresist layer 44.

In this preferred embodiment, the stress of the silicon nitride layer 38 is about −1.0 Gpa to 2.0 Gpa (in a range from a compressive stress of 1.0 Gpa to a tensile stress of 2.0 Gpa). The silicon nitride layer 38 includes 30 to 80 atomic percent silicon, 20 to 70 atomic percent nitrogen, and 0 to 10 atomic percent oxygen. It deserves to be mentioned that the silicon nitride layer 38 has a hydrogen concentration of more than $10^{22}$ atoms/cm$^3$.

Figure 9:
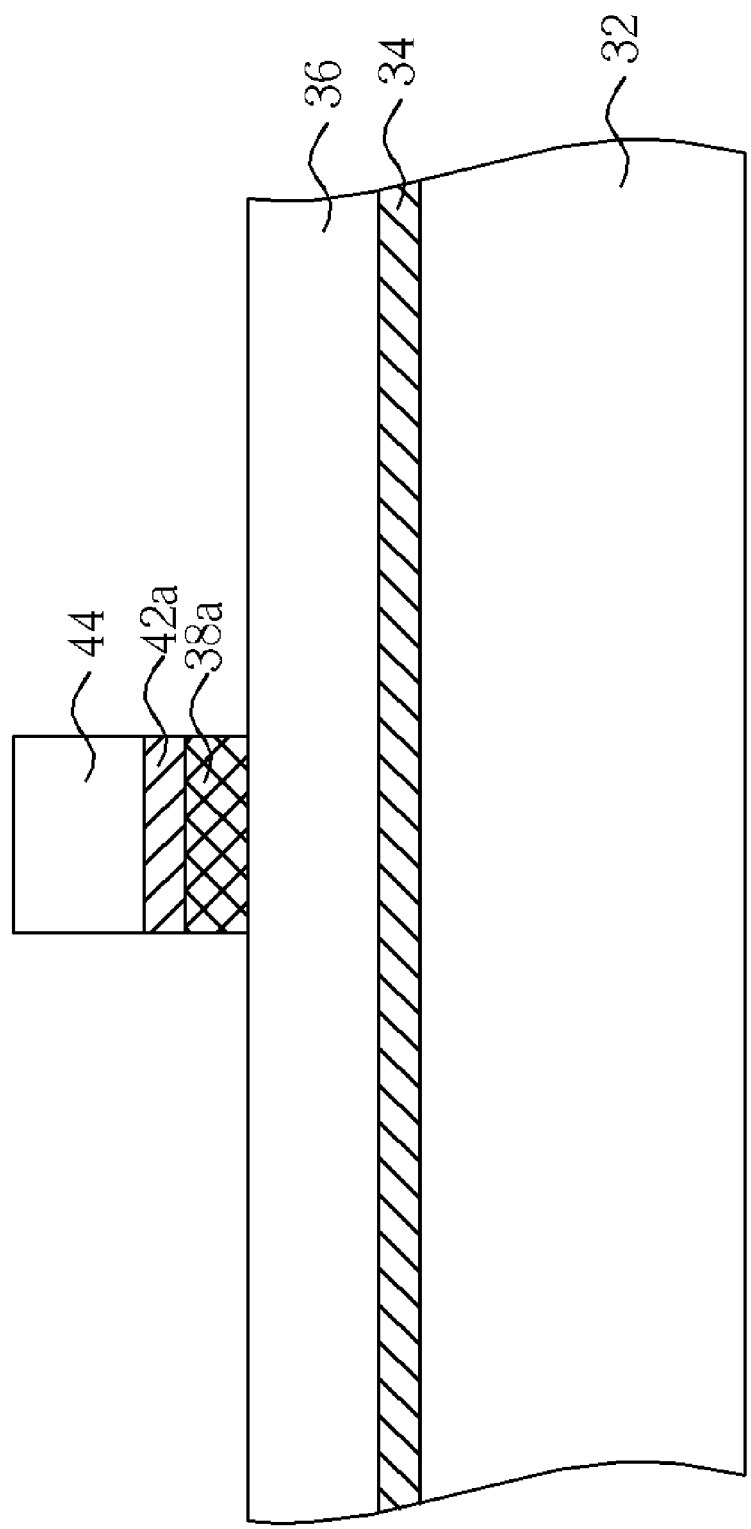
Figure 10:
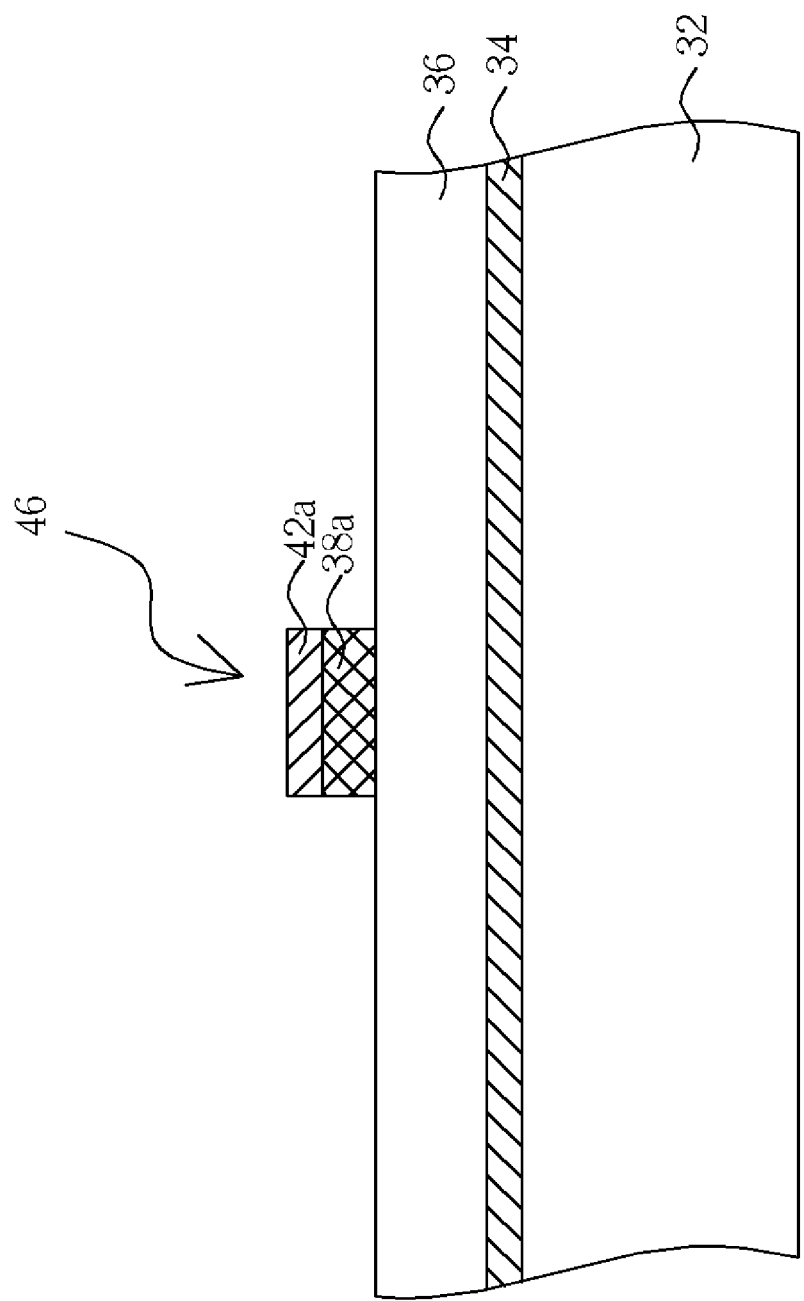
Figure 11:
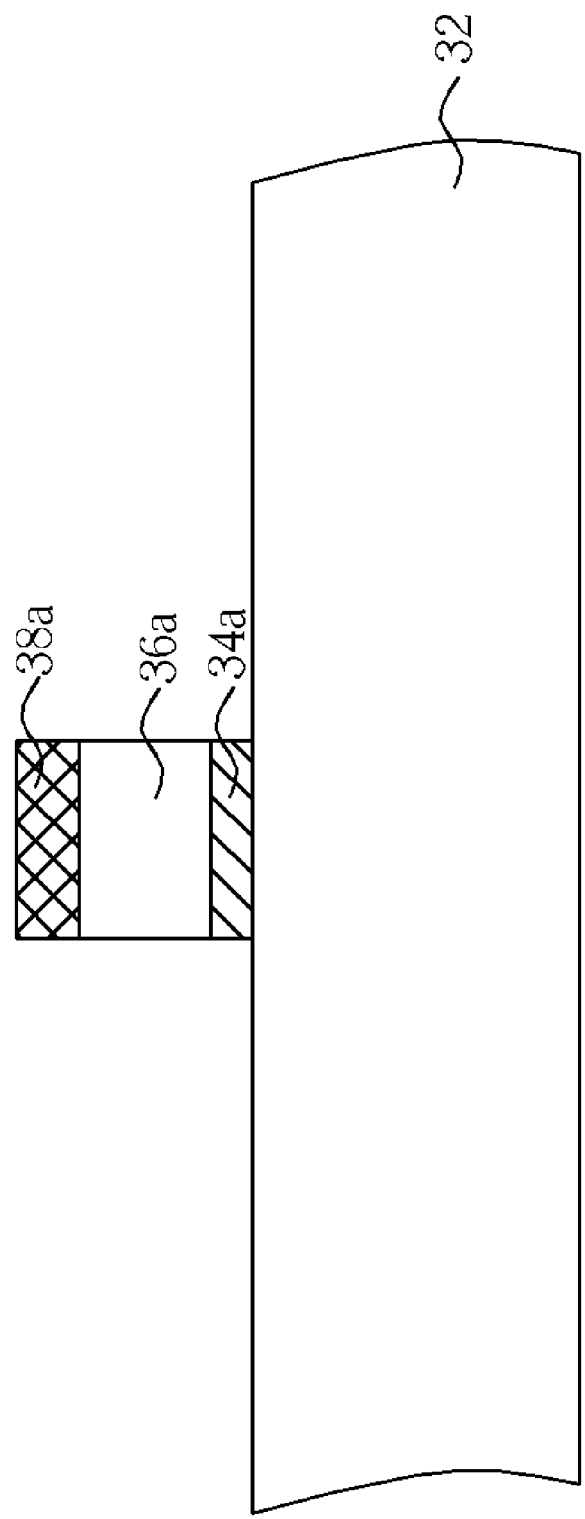

As shown in FIG. 9, the silicon oxide layer 42 and the silicon nitride layer 38 are etched by utilizing the patterned photoresist layer 44 as a mask. Thus, the pattern is transferred from the patterned photoresist layer 44 to the silicon oxide layer 42 and the silicon nitride layer 38, and a patterned silicon oxide layer 42a and a patterned silicon nitride layer 38a are formed. Next, as shown in FIG. 10, the patterned photoresist layer 44 is removed by an ashing process. The patterned silicon oxide layer 42a and the patterned silicon nitride layer 38a remain to form a patterned hard mask 46 so that the patterned hard mask 46 has a higher etching selectivity ratio. As shown in FIG. 11, the conductive layer 36 and the dielectric layer 34 are etched by utilizing the patterned hard mask 46 as an etching mask. Meanwhile, the patterned silicon oxide layer 42a may be etched and consumed. The etching process can even consume all the patterned silicon oxide layer 42a, and still keep a patterned dielectric layer 34a, a patterned conductive layer 36a, and the patterned silicon nitride layer 38a on the substrate 32.

Figure 12:
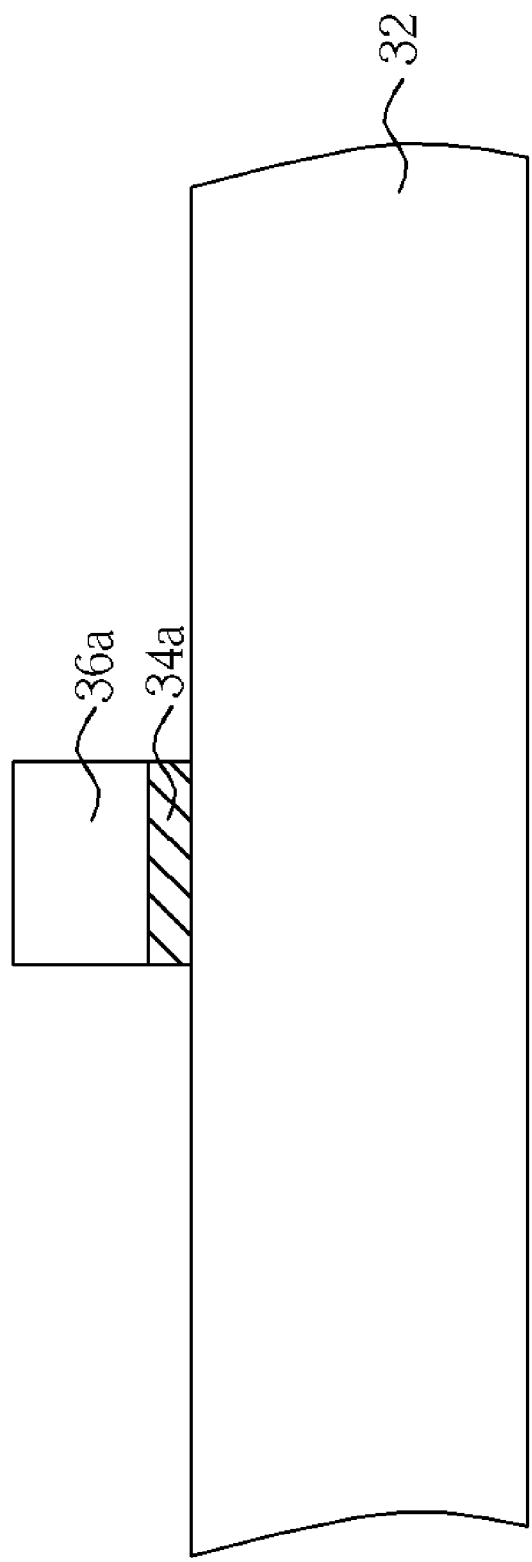

Finally, as shown in FIG. 12, a wet etching process is performed to remove the patterned hard mask 46 by utilizing an etching solution. The patterned conductive layer 36a and the patterned dielectric layer 34a remain, wherein the patterned conductive layer 36a is utilized as a gate of a MOS device, a gate of strained-silicon transistor, or a semiconductor component, such as a capacitor, a resistor, a safety fuse, etc. The resulting substrate may be subsequently processed after the patterned hard mask 46 is removed as desired in the LDD process or other semiconductor manufacturing processes that are known in the art.

According to the preferred embodiment of the present invention, the above-mentioned wet etching process uses the etching solution at a temperature greater than 60° C. and less than 155° C. to remove the patterned hard mask 46. The etching solution at least includes phosphoric acid, and can be a solution of phosphoric acid in water, for example. Furthermore, the phosphoric acid concentration of the etching solution can be adjusted to etch the silicon nitride layer at a rate of about 40 to 400 angstroms/min. The adjustment depends on factors such as etching temperature, etching time, and the composition of the etched materials. The etching solution may optionally contain additional agents, such as buffering agents and/or other acids.

It deserves to be mentioned that, because the silicon nitride layer of the present invention can be removed by the phosphoric acid solution at the temperature greater than 60° C. and less than 155° C., the present invention can effectively prevent the patterned polysilicon conductive layer from being attacked by the prior art phosphoric acid solution with high temperature. Without the defects in the patterned polysilicon conductive layer, the elements are therefore protected.

Figure 13:
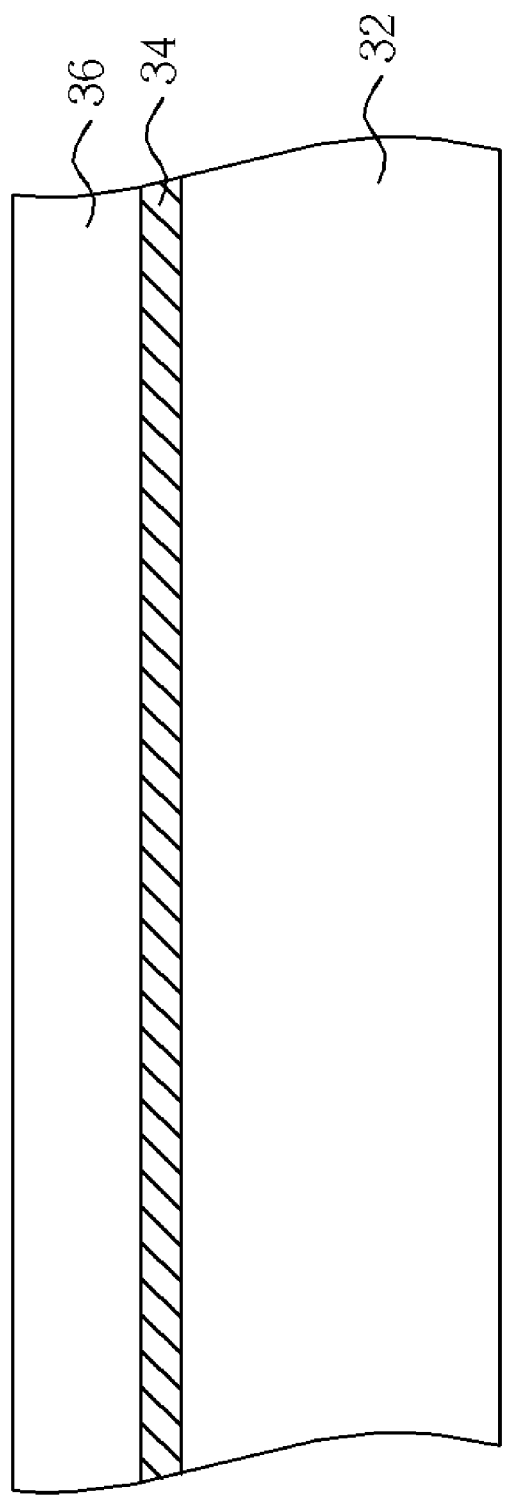
FIG. 13 through FIG. 18 are schematic diagrams showing the method of etching a conductive layer according to another preferred embodiment of the present invention.

In addition, the step of forming the patterned hard mask 46 does not have to form the silicon oxide layer 42 of the previous preferred embodiment. Please refer to FIG. 13 through FIG. 18. FIG. 13 through FIG. 18 are schematic diagrams showing the method of etching a conductive layer according to another preferred embodiment of the present invention, wherein like number numerals designate similar or the same parts, regions, or elements. As shown in FIG. 13, a substrate 32 is provided, including a dielectric layer 34 and a conductive layer 36 on its surface in order. The substrate 32 may be a semiconductor wafer or a SOI. The dielectric layer 34 usually includes high-k materials, such as silicon oxide. The conductive layer 36 includes silicon, polysilicon, or doped polysilicon.

Figure 14:
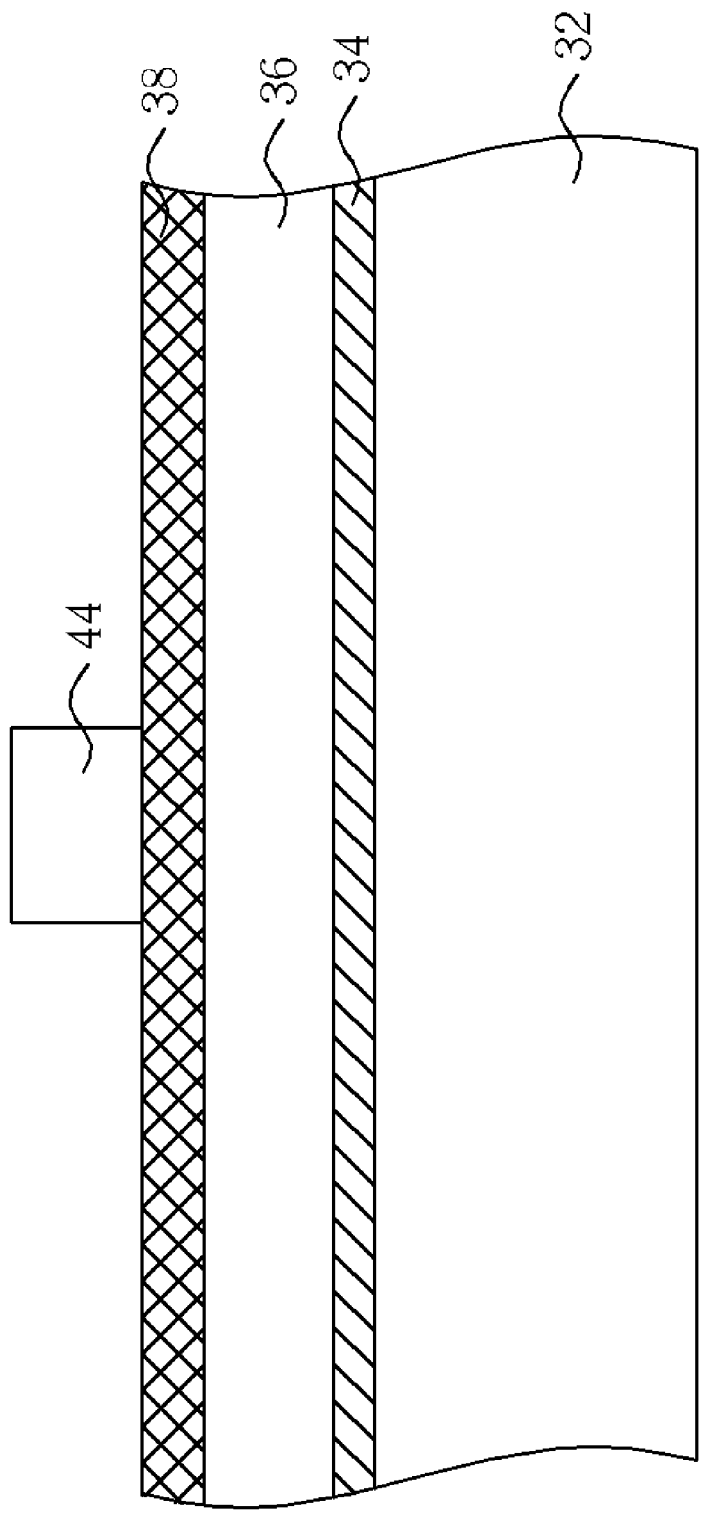

Subsequently, as shown in FIG. 14, a silicon nitride layer 38 and a patterned photoresist layer 44 are formed on the conductive layer 36 in order. For instance, the silicon nitride layer 38 is first deposited by a deposition process, and a photoresist layer is spun on the silicon oxide layer 42. The photoresist layer is subsequently patterned by an exposure-and-development process so as to transform the photoresist layer into the patterned photoresist layer 44. In this preferred embodiment, the silicon nitride layer 38 includes 30 to 80 atomic percent silicon, 20 to 70 atomic percent nitrogen, and 0 to 10 atomic percent oxygen. It deserves to be mentioned that the silicon nitride layer 38 has a hydrogen concentration of more than $10^{22}$ atoms/cm$^3$.

Figure 15:
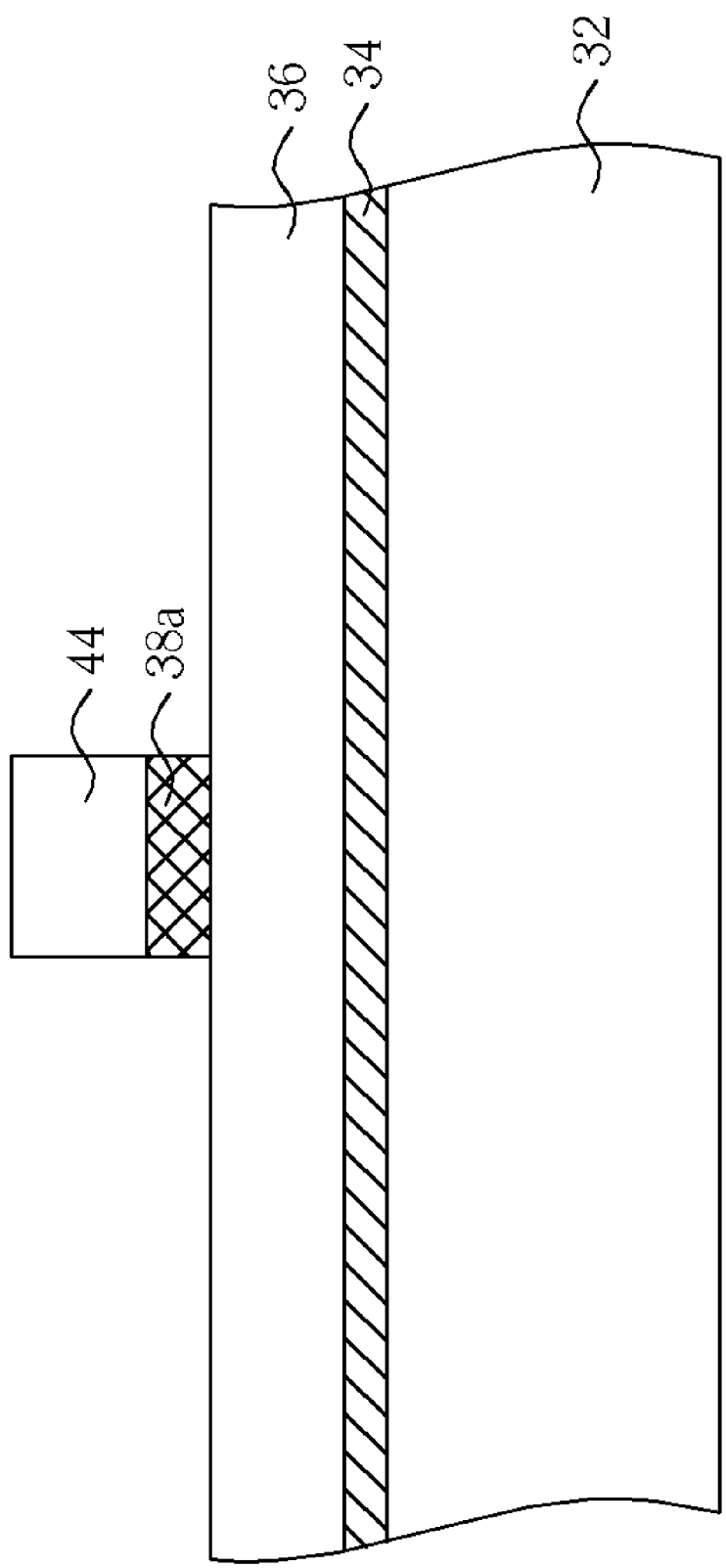
Figure 16:
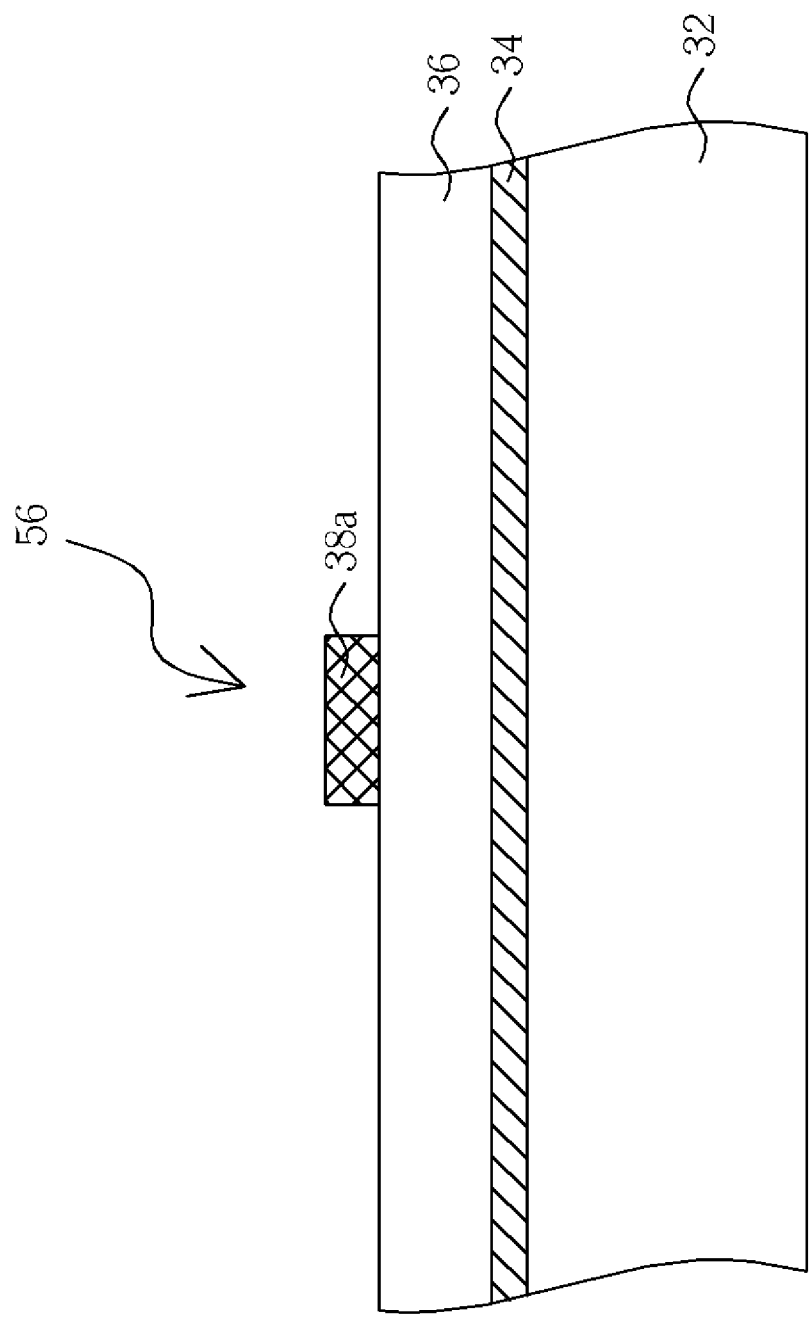
Figure 17:
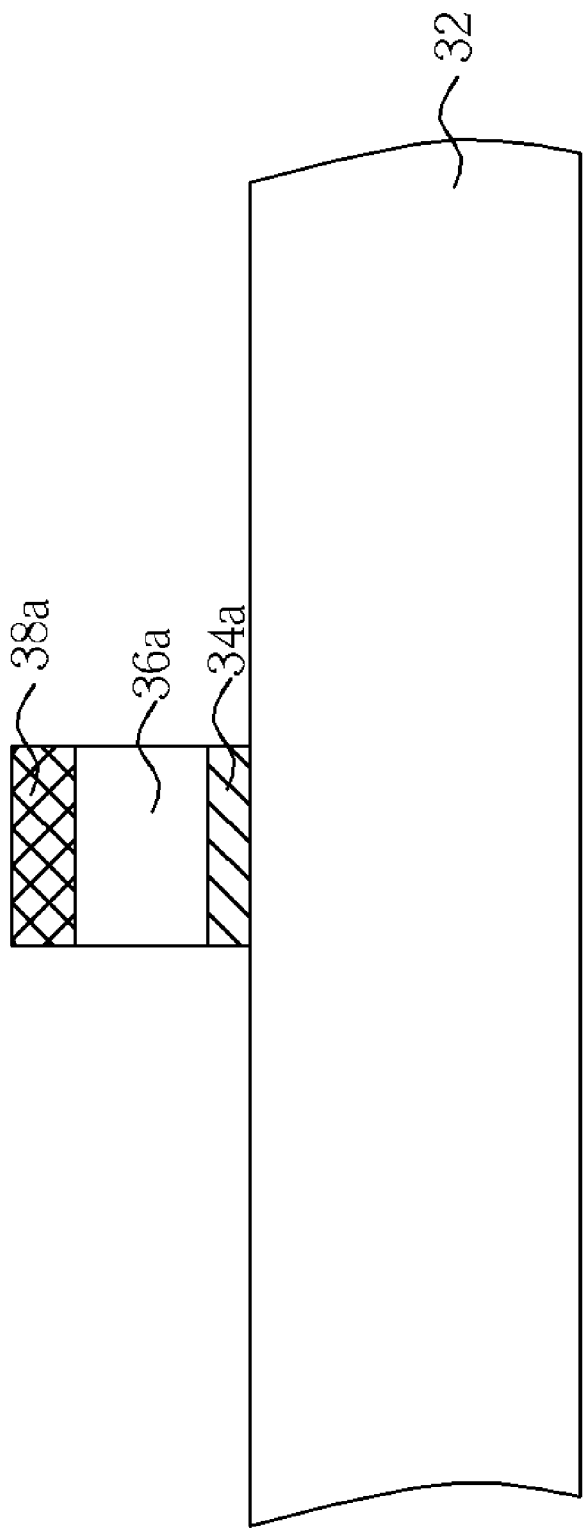
Figure 18:
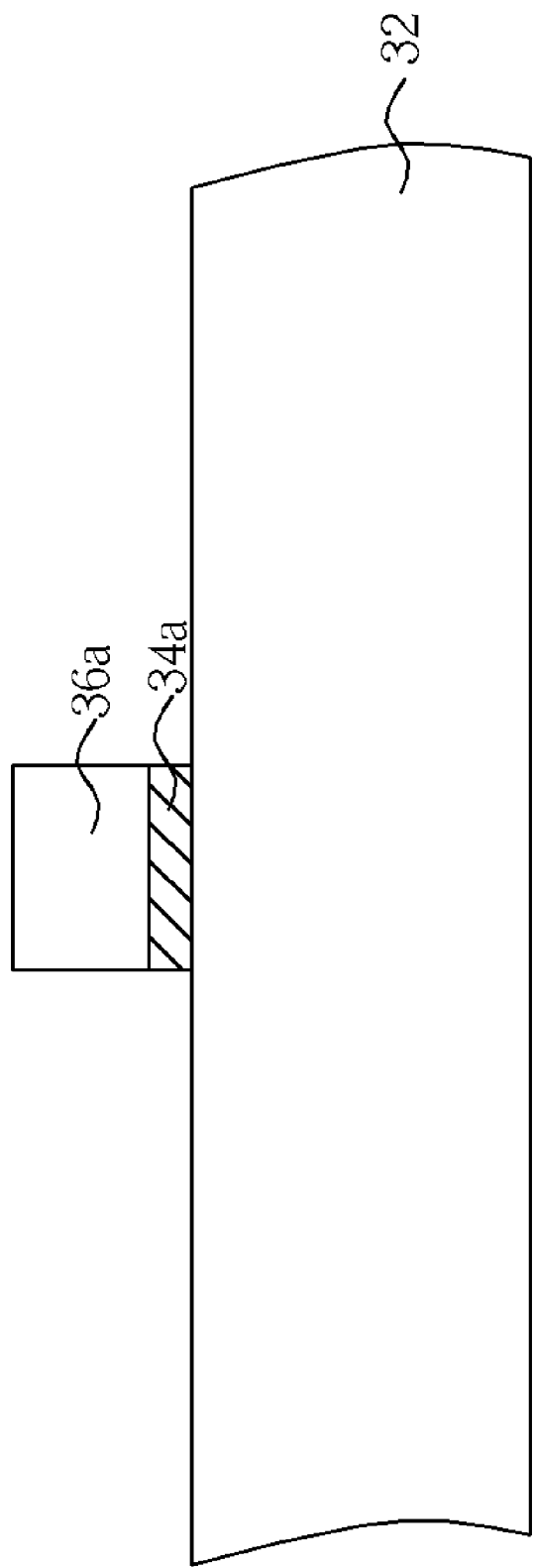

As shown in FIG. 15, the silicon nitride layer 38 is etched by utilizing the patterned photoresist layer 44 as a mask, so the pattern is transferred from the patterned photoresist layer 44 to the silicon nitride layer 38, and a patterned silicon nitride layer 38a is formed. Next, as shown in FIG. 16, the patterned photoresist layer 44 is removed, and a patterned hard mask 46 remains. As shown in FIG. 17, the conductive layer 36 and the dielectric layer 34 are etched by utilizing the patterned silicon nitride layer 38a as an etching mask. Meanwhile, the etching process still keeps a patterned dielectric layer 34a, a patterned conductive layer 36a, and the patterned silicon nitride layer 38a on the substrate 32. Finally, as shown in FIG. 18, a wet etching process is performed to remove the patterned silicon nitride layer 38a by utilizing an etching solution. The etching solution includes phosphoric acid at a temperature of greater than 60° C. and less than 155° C. Meanwhile, the patterned conductive layer 36a and the patterned dielectric layer 34a remain.

Figure 20:
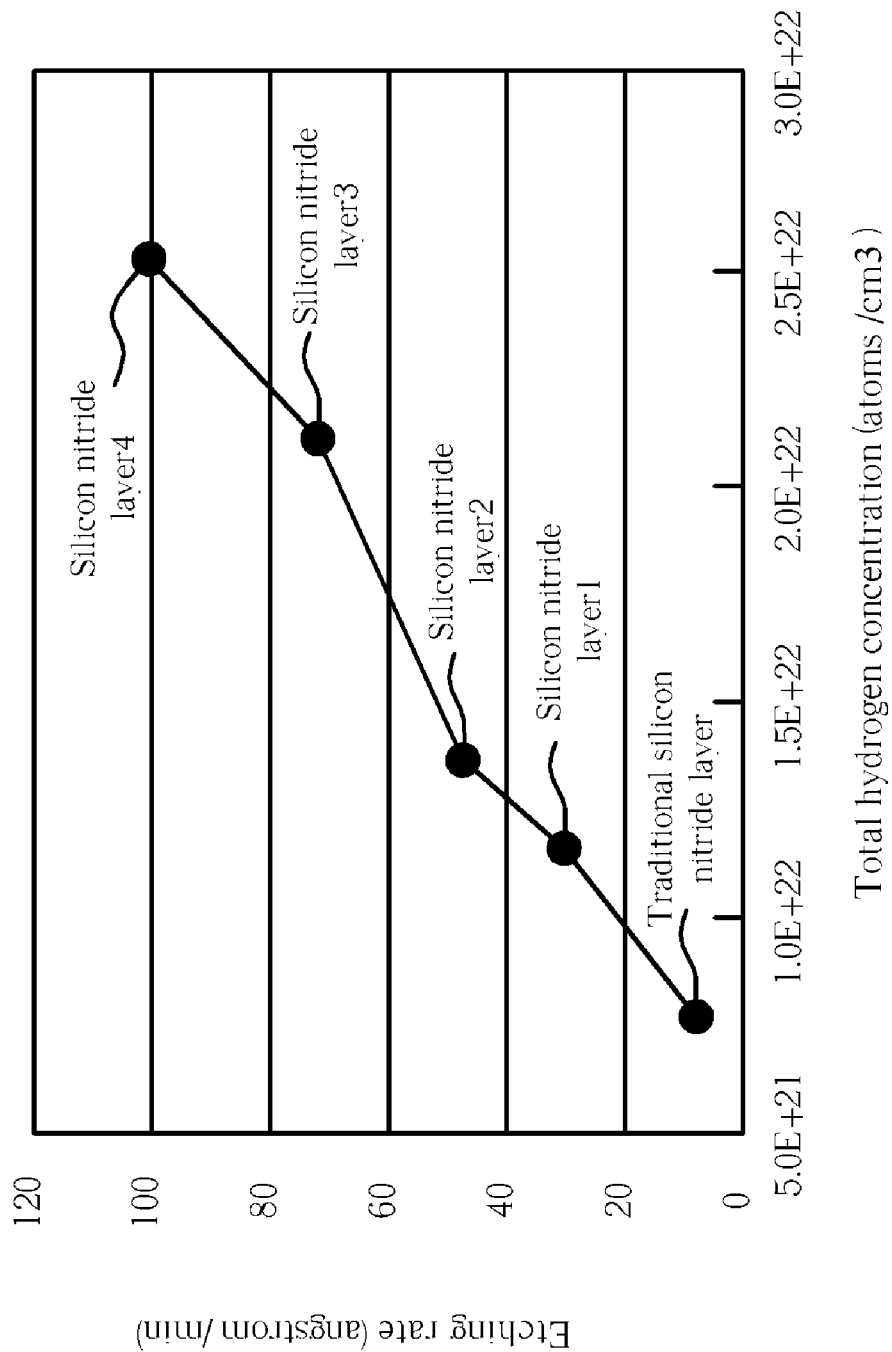
FIG. 20 is a schematic diagram illustrating the relationship between the total hydrogen concentration of the silicon nitride layer and the etching rate of the silicon nitride layer.

The etching solution containing phosphoric acid with low temperature exhibits a great etching ability for silicon nitride with a high concentration of hydrogen. Please refer to FIG. 19 and FIG. 20. FIG. 19 is a chart illustrating the components of silicon nitride layers and the etching rates of the silicon nitride layers. FIG. 20 is a schematic diagram illustrating the relationship between total hydrogen concentration of the silicon nitride layer and etching rate of the silicon nitride layer. Five samples, including a traditional silicon nitride layer, a silicon nitride layer 1, a silicon nitride layer 2, a silicon nitride layer 3, and a silicon nitride layer 4, are measured by Fourier transform infrared (FTIR) to obtain the data of the components. Thereafter, these five silicon nitride layers are etched by an etching solution containing phosphoric acid in water at a temperature of 120° C. so as to obtain the etching rates. As shown in FIG. 19 and FIG. 20, the etching rate of the silicon nitride layer is in positive correlation with the total hydrogen concentration of the silicon nitride layer. Thus, as the total hydrogen concentration of the silicon nitride layer increases, the etching rate of the silicon nitride layer increases, too.

As the traditional silicon nitride layer is etched by the etching solution containing phosphoric acid in water at a temperature of 120° C., the etching rate is only 10 angstroms/min. As a result, it takes a long time to remove the traditional silicon nitride layer. In contrast, as the total hydrogen concentration of the silicon nitride layer reaches $2.50*10^{22}$ atoms/cm$^3$, the etching rate of the silicon nitride layer reaches 100 angstroms/min, and the operation time is substantially decreased. Because the present invention utilizes the patterned silicon nitride layer 38a having a hydrogen concentration of more than $10^{22}$ atoms/cm$^3$ as the patterned hard mask 46, the patterned silicon nitride layer 38a can be easily removed by the phosphoric acid solution at a temperature of 120° C.

In consideration of the etching ability, the phosphoric acid solution with low temperature can easily etch the silicon nitride layer including high concentration of hydrogen, and does not damage polysilicon and oxide. Thus, the present invention can remove the silicon nitride layer effectively, and prevent the structures of polysilicon and silicon oxide from being damaged by the prior art phosphoric acid solution with high temperature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a gate, comprising:
   providing a substrate, the substrate comprising a dielectric layer and a conductive layer, the dielectric layer being disposed on top of the substrate, the conductive layer being disposed on top of the dielectric layer;
   forming a patterned hard mask on the conductive layer, the patterned hard mask comprising a silicon nitride layer, which comprises 30 to 80 atomic percent silicon, 20 to 70 atomic percent nitrogen, 0 to 10 atomic percent oxygen, and a hydrogen concentration of more than $10^{22}$ atoms/cm$^3$;
   etching the conductive layer and the dielectric layer by utilizing the patterned hard mask as a mask; and
   removing the patterned hard mask by utilizing an etching solution, wherein the etching solution comprises at least phosphoric acid.

2. The method of claim 1, wherein the substrate comprises a semiconductor wafer or a silicon-on-insulator.

3. The method of claim 1, wherein the dielectric layer comprises silicon oxide.

4. The method of claim 1, wherein the conductive layer comprises polysilicon.

5. The method of claim 1, wherein the step of forming the patterned hard mask comprises:
   forming a silicon nitride layer and a photoresist layer, the silicon nitride layer being disposed on top of the conductive layer, the photoresist layer being disposed on top of the silicon nitride layer;
   performing an exposure-and-development process on the photoresist layer so as to turn the photoresist layer into a patterned photoresist layer;
   etching the silicon nitride layer by utilizing the patterned photoresist layer as a mask so as to transfer a pattern from the patterned photoresist layer to the silicon nitride layer, and form a patterned silicon nitride layer; and
   removing the patterned photoresist layer.

6. The method of claim 1, wherein the patterned hard mask further comprises silicon oxide.

7. The method of claim 6, wherein the step of forming the patterned hard mask comprises:
   forming a silicon nitride layer, a silicon oxide layer and a patterned photoresist layer, the silicon nitride layer being disposed on top of the conductive layer, the silicon oxide layer being disposed on top of the silicon nitride layer, the photoresist layer being disposed on top of the silicon oxide layer;
   etching the silicon oxide layer and the silicon nitride layer by utilizing the patterned photoresist layer as a mask so as to transfer a pattern from the patterned photoresist layer to the silicon oxide layer and the silicon nitride layer, and form a patterned silicon oxide layer and a patterned silicon nitride layer; and removing the patterned photoresist layer.

8. The method of claim 1, wherein the etching solution has a temperature greater than 60° C. and less than 155° C.

9. A method of etching a conductive layer, comprising:

providing a substrate, the substrate comprising a dielectric layer and the conductive layer, the dielectric layer being disposed on top of the substrate, the conductive layer being disposed on top of the dielectric layer;

forming a patterned silicon nitride layer on the conductive layer, the patterned silicon nitride layer having 30 to 80 atomic percent silicon, 20 to 70 atomic percent nitrogen, 0 to 10 atomic percent oxygen, and a hydrogen concentration of more than $10^{22}$ atoms/cm$^3$;

etching the conductive layer and the dielectric layer by utilizing the patterned silicon nitride layer as a mask; and removing the patterned silicon nitride layer by utilizing an etching solution, wherein the etching solution comprises at least phosphoric acid.

10. The method of claim 9, wherein the substrate comprises a semiconductor wafer or a silicon-on-insulator.

11. The method of claim 9, wherein the dielectric layer comprises silicon oxide.

12. The method of claim 9, wherein the conductive layer comprises polysilicon.

13. The method of claim 9, wherein the step of forming the patterned silicon nitride layer comprises:

forming a silicon nitride layer and a photoresist layer, the silicon nitride layer being disposed on top of the conductive layer, the photoresist layer being disposed on top of the silicon nitride layer;

performing an exposure-and-development process on the photoresist layer so as to turn the photoresist layer into a patterned photoresist layer;

etching the silicon nitride layer by utilizing the patterned photoresist layer as a mask so as to transfer a pattern from the patterned photoresist layer to the silicon nitride layer, and form the patterned silicon nitride layer; and removing the patterned photoresist layer.

14. The method of claim 9, wherein the step of forming the patterned silicon nitride layer farther comprises forming a patterned silicon oxide layer on a surface of the patterned silicon nitride layer, and the patterned silicon nitride layer and the patterned silicon oxide layer form a patterned hard mask.

15. The method of claim 14, wherein the step of forming the patterned hard mask comprises:

forming a silicon nitride layer, a silicon oxide layer and a patterned photoresist layer, the silicon nitride layer being disposed on top of the conductive layer, the silicon oxide layer being disposed on top of the silicon nitride layer, the photoresist layer being disposed on top of the silicon oxide layer;

etching the silicon oxide layer and the silicon nitride layer by utilizing the patterned photoresist layer as a mask so as to transfer a pattern from the patterned photoresist layer to the silicon oxide layer and the silicon nitride layer, and form the patterned silicon oxide layer and the patterned silicon nitride layer; and removing the patterned photoresist layer.

16. The method of claim 9, wherein the etching solution has a temperature greater than 60° C. and less than 155° C.

17. The method of claim 9, wherein the conductive layer is utilized as a gate of metal-oxide semiconductor (MOS), a gate of strained-silicon transistor, a capacitor, a resistor, or a safety fuse.

* * * * *